(12) United States Patent
Wang et al.

(10) Patent No.: US 9,865,232 B2
(45) Date of Patent: Jan. 9, 2018

(54) SOURCE DRIVING DEVICE, TIMING CONTROLLING DEVICE, METHOD FOR RECEIVING DISPLAY SIGNAL AND METHOD FOR TRANSMITTING DISPLAY SIGNAL

(71) Applicant: AU Optronics Corporation, Hsin-Chu (TW)

(72) Inventors: Hung-Chi Wang, Hsin-Chu (TW); Wen-Chiang Huang, Hsin-Chu (TW)

(73) Assignee: AU OPTRONICS CORP., Hsin-Chu (TW)

(*) Notice: Subject to any disclaimer, the term of this patent is extended or adjusted under 35 U.S.C. 154(b) by 0 days.

(21) Appl. No.: 14/824,242

(22) Filed: Aug. 12, 2015

(65) Prior Publication Data

US 2016/0351169 A1    Dec. 1, 2016

(30) Foreign Application Priority Data

May 27, 2015   (TW) .............................. 104117029 A

(51) Int. Cl.
| | | |
|---|---|---|
| *G09G 5/00* | (2006.01) | |
| *G09G 3/00* | (2006.01) | |
| *G09G 3/20* | (2006.01) | |
| *G09G 3/36* | (2006.01) | |
| *H03L 7/08* | (2006.01) | |
| *H04N 5/12* | (2006.01) | |
| *H03F 1/32* | (2006.01) | |
| *G06F 1/32* | (2006.01) | |
| *G09G 5/18* | (2006.01) | |

(52) U.S. Cl.
CPC ............. *G09G 5/18* (2013.01); *H03L 7/0807* (2013.01)

(58) Field of Classification Search
CPC ........ G09G 5/18; G09G 3/2096; G09G 5/003; G09G 3/3677; G09G 3/20; G09G 3/3688; H04L 7/033; H04L 25/49; H04N 5/126; H03L 7/085; H03L 7/0898; G06F 3/038; H03G 9/005
See application file for complete search history.

(56) References Cited

U.S. PATENT DOCUMENTS 4,733,404 A * 3/1988 Ostoich ................. H03L 7/0807
                                                           327/141
6,573,944 B1 * 6/2003 Altmanshofer ........ H04N 5/126
                                                           348/540
(Continued)

FOREIGN PATENT DOCUMENTS

KR    20100050935    *   1/2011    ........... G09G 3/3611
KR    20110094839    *   8/2011    ............... G09G 3/20

*Primary Examiner* — Lin Li
(74) *Attorney, Agent, or Firm* — McClure, Qualey & Rodack, LLP

(57) ABSTRACT

A source driving device includes a locking module, a controlling module and a decoding module. The locking module executes a locking process selectively in a first band or a second band according to a band setting signal in order to lock a first clock signal synchronized with a first display signal. The controlling module is coupled to the locking module for comparing a control voltage with a reference voltage in the locking process and generates the band setting signal accordingly. The decoding module is coupled to the locking module for generating a decoded signal according to the first display signal and the first clock signal.

14 Claims, 7 Drawing Sheets

(56) References Cited

U.S. PATENT DOCUMENTS

| | | | |
|---|---|---|---|
| 9,508,321 B2* | 11/2016 | Oh | G09G 3/3688 |
| 2006/0001635 A1* | 1/2006 | Nakajima | G09G 3/3677 |
| | | | 345/98 |
| 2006/0244709 A1* | 11/2006 | Lin | G09G 3/3688 |
| | | | 345/100 |
| 2009/0079746 A1* | 3/2009 | Howard | G06F 1/3218 |
| | | | 345/502 |
| 2010/0117741 A1* | 5/2010 | Goto | H03L 7/0898 |
| | | | 331/17 |
| 2010/0231787 A1* | 9/2010 | Kim | G09G 3/2096 |
| | | | 348/503 |
| 2012/0328114 A1* | 12/2012 | Takeuchi | H03G 9/005 |
| | | | 381/57 |
| 2014/0062994 A1* | 3/2014 | Chen | G09G 5/003 |
| | | | 345/214 |

* cited by examiner

SOURCE DRIVING DEVICE, TIMING CONTROLLING DEVICE, METHOD FOR RECEIVING DISPLAY SIGNAL AND METHOD FOR TRANSMITTING DISPLAY SIGNAL

CROSS-REFERENCE TO RELATED APPLICATIONS

This non-provisional application claims priority under 35 U.S.C. §119(a) on Patent Application No. 104117029 filed in Taiwan, R.O.C. on May 27, 2015, the entire contents of which are hereby incorporated by reference.

BACKGROUND

Technical Field

The present disclosure relates to a source driving device, a timing controlling device, a method for receiving display signal, and a method for transmitting display signal, particularly to a source driving device, a timing controlling device, a method for receiving display signal, and a method for transmitting display signal with band detection functions.

Description of the Related Art

As the advancement of technology, the display panel becomes more and more popular in people's daily lives. No matter the smart phones or the vehicle mounted devices with small size panels, or the tablets or the desktops with medium size panels, or even the televisions with large size panels, all kinds of panels are developed towards high-resolution. Moreover, different kinds of multimedia applications including 3D technology increase the data transmission volume of the display panel, so that the data transmission rate is increased accordingly.

However, in practice, the panel signal transmission technology faces the bottleneck because of the advancement of the panel resolution and the data transmission rate. Therefore, how to improve the current panel signal transmission technology to enhance the signal transmission efficiency and handle different kinds of resolutions becomes an urgent problem to the developer.

SUMMARY

A source driving device includes a locking module, a controlling module, and a decoding module. The locking module executes a locking process in a first band or a second band selectively according to a band setting signal, and the locking process is for the locking module to lock a first clock signal synchronized to a first display signal. The controlling module is coupled to the locking module, and is for comparing a control voltage with a reference voltage in the locking process to generate the band setting signal accordingly. The decoding module is coupled to the locking module, and is for generating a decoded signal according to the first display signal and the first clock signal.

A method for receiving display signal for a source driving device includes executing a locking process in a first band or a second band selectively according to a band setting signal, the locking process for locking a first clock signal synchronized to a first display signal, comparing a control voltage and a reference voltage in the locking process to generate the band setting signal accordingly, and generating a decoded signal according to the first display signal and the first clock signal.

A timing controlling device includes a locking module, a controlling module, and a decoding module. The locking module is for executing a locking process in a first band or a second band selectively according to a band setting signal, and the locking process is for the locking module to lock a third clock signal synchronized to a third display signal. The controlling module is coupled to the locking module, and is for comparing a control voltage with a reference voltage in the locking process to generate the band setting signal accordingly. The decoding module is coupled to the locking module, and is for generating a decoded signal according to the third display signal and the third clock signal.

The contents of the present disclosure set forth and the embodiments hereinafter are for demonstrating and illustrating the spirit and principles of the present disclosure, and for providing further explanation of the claims.

BRIEF DESCRIPTION OF THE DRAWINGS

The present disclosure will become more fully understood from the detailed description given hereinbelow and the accompanying drawings, which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
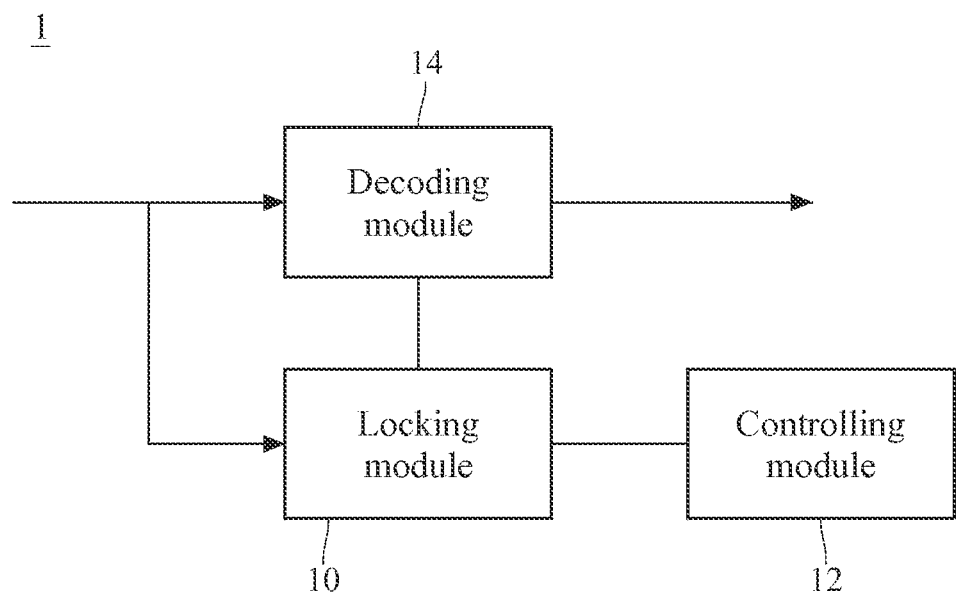
FIG. 1 is a structural diagram of the source driving device according to an embodiment.

Please refer to FIG. 1. FIG. 1 is a structural diagram of the source driving device according to an embodiment. As shown in FIG. 1, the source driving device 1 includes a locking module 10, a controlling module 12, and a decoding module 14. The locking module 10 receives a first display signal from the timing controlling device and executes a locking process in a first band or a second band selectively according to the band setting signal for the locking module 10 to lock a first clock signal synchronized to the first display signal. The controlling module 12 is coupled to the locking module 10 and is for comparing a control voltage and a reference voltage in the locking process to generate the band setting signal accordingly. The decoding module 14 is coupled to the locking module 10 and is for generating a decoded signal according to the first display signal and the first clock signal. The decoded signal includes the digital color data and the digital color data is converted to analog voltage signal through digital to analog conversion (DAC) to drive the panel to display the images corresponding to the color data. In practice, the selectivity of the band is added or the size of the band is adjusted according to the capability of the locking module 10 and the efficiency concerns. For example, when the supported frequency range of the locking module 10 is wider, more bands are divided. On the contrary, when the supported frequency range of the locking module 10 is narrower, fewer bands are divided. When enhancing the efficiency of the locking module 10 is needed, the band is adjusted to smaller to increase the locking stability. Therefore, the locking module 10 and the controlling module are able to capture the synchronized first clock signal from the first display signal in different bands. The decoding module 14 decodes the first display signal according to the first clock signal to generate the decoded signal.

Figure 2:
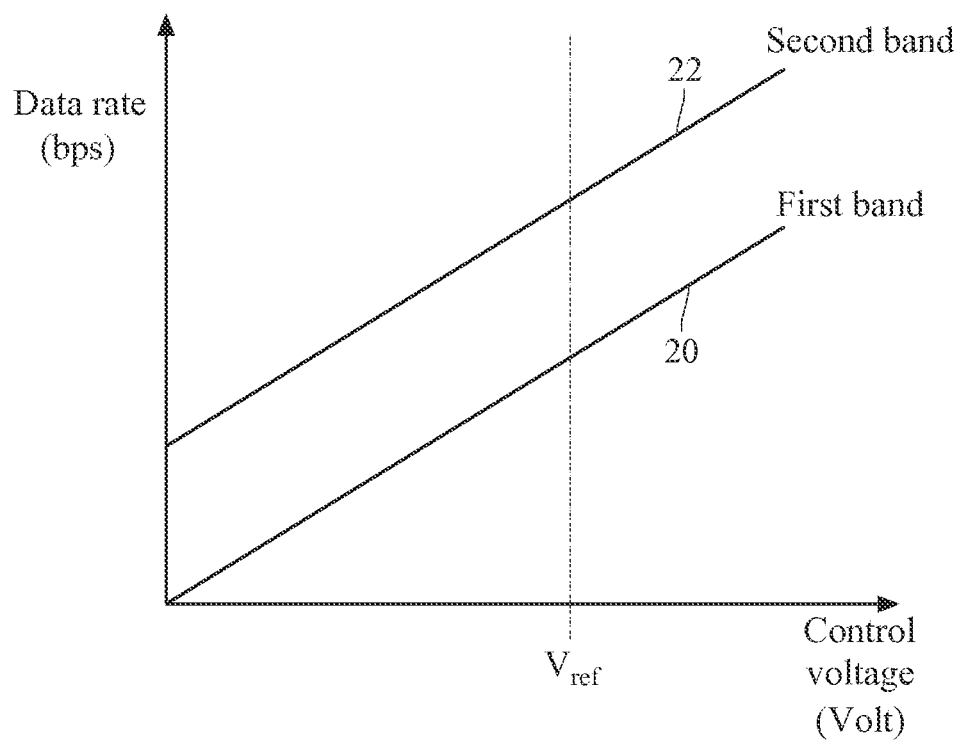
FIG. 2 is a diagram of the band setting according to an embodiment.

Please refer to FIG. 1 and FIG. 2. FIG. 2 is a diagram of the band setting according to an embodiment. For example, when the locking process starts, the locking module 10 executes the locking process in the first band by changing the control voltage. Therefore, the locking process is executed along the locking process tracking line 20. Once the first clock signal synchronized to the first display signal is locked, the control voltage maintains the voltage value of the locking time to continuously generate the first clock signal. However, before the first clock signal synchronized to the first display signal is not locked yet, the controlling module 12 continuously monitors the variation of the control voltage. When the control voltage is substantially greater than the reference voltage Vref, the controlling module 12 generates the band setting signal to control the locking module 10 to switch to the second band to execute the locking process. In other words, the locking process is executed along the locking process tracking line 22.

For example, the band is divided to 3 bands, such as 0.1 giga bits per second (Gbps)~3.6 Gbps, 3 Gbps~6.4 Gbps, and 6 Gbps~10 Gbps. Assuming that the first display signal received by the source driving device 1 is approximate to the signal in 7.3 Gbps, and the reference voltage Vref is approximate to 2.35 volts, firstly the locking module 10 executes the locking process in the 0.1 Gbps~3.6 Gbps band. The control voltage increases from the initial value approximate to 0.5 volts and the first display signal is not in the 0.1 Gbps~3.6 Gbps band. When the control voltage is approximate to 2.35 volts, the controlling module 12 generates the band setting signal to control the locking module 10 to switch to the 3 Gbps~6.4 Gbps band to execute locking process continuously. Similarly, the control voltage increases from the initial value approximate to 0.5 volts and when the control voltage is substantially greater than 2.35 volts again, the controlling module 12 generates the band setting signal again to control the locking module 10 to switch to 6 Gbps~10 Gbps band to execute locking process continuously. Last, the locking module 10 locks the first clock signal synchronized to the first display signal in the 6 Gbps~10 Gbps band.

In another embodiment, when the locking module 10 executes the locking process in the first band, the controlling module 12 compares the control voltage with the reference voltage Vref and calculates the frequency of which the control voltage is substantially greater than the reference voltage Vref. When the frequency is substantially greater than the threshold, the controlling module 12 generates the band setting signal to control the locking module 10 to switch to the second band to execute the locking process. For example, the threshold is, but not limited to, 31, 63, 127, or 255. In practice, when the threshold is substantially greater, the stability and the success rate of the locking process are higher, but the locking time is possibly longer due to the repetitive trial time of the non-target band. On the contrary, when the threshold is smaller, the stability and the success rate of the locking process is lower, but the locking time is possibly shorter due to the repetitive trial time of the non-target band. Therefore, the adequate threshold is determined according to the composite considerations of the stability, the success rate of the locking process, and the finished locking time. Consequently, the incorrect judgment of the locking process convergence is avoided when the control voltage is close to the reference voltage Vref and the control voltage overpasses Vref temporarily. The stability and the success rate of the locking process are increased accordingly.

Figure 3:
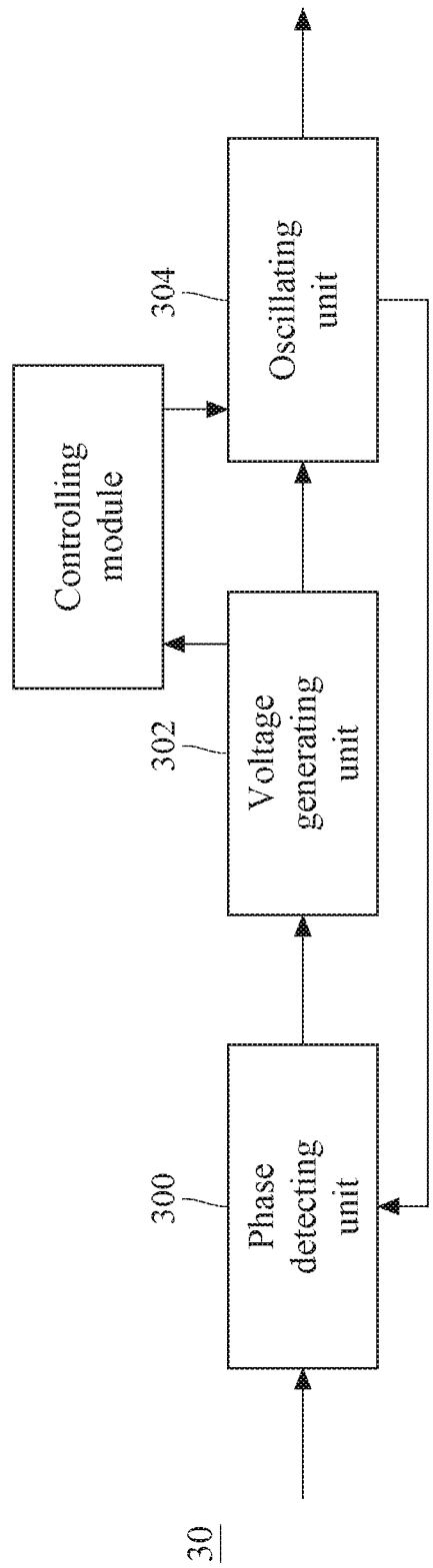
FIG. 3 is a structural diagram of the locking module according to an embodiment.

Please refer to FIG. 3. FIG. 3 is a structural diagram of the locking module according to an embodiment. As shown in FIG. 3, the locking module 30 includes a phase detecting unit 300, a voltage generating unit 302, and an oscillating unit 304. The phase detecting unit 300 is for comparing a phase of the first display signal with a phase of the second clock signal from the oscillating unit 304 to generate a comparison result. The voltage generating unit 302 generates the control voltage according to the comparison result. The oscillating unit 304 generates the second clock signal according to the band setting signal and the control voltage. When the comparison result generated by the phase detecting unit 300 indicates that the phase of the first display signal and the phase of the second clock signal are substantially the same, the oscillating unit outputs the second clock signal as the first clock signal for representing that the locking process successfully captures the first clock signal from the first display signal. Therefore, the outputted first clock signal is provided to the decoding module 14 in FIG. 1 as the decoding clock reference. After successfully capturing the first clock signal from the first display signal, the phase detecting unit 300 continuously compares the phase of the first display signal with the phase of the second clock signal to ensure the stability of the clock signal, wherein the second clock signal is the first clock signal. When the comparison result generated by the phase detecting unit 300 indicates that the phase of the first display signal and the phase of the second clock signal are different, the oscillating unit 304 still outputs the second clock signal as the first clock signal, but currently the outputted first clock signal is not the correct clock signal. Therefore, the outputted first clock signal is provided to the decoding module 14 in FIG. 1 as the decoding clock reference, but the correct decoded signal is not generated accordingly. In practice, when the correct clock signal is not able to be captured in all of the bands, the locking mechanism is repeated.

Figure 4:
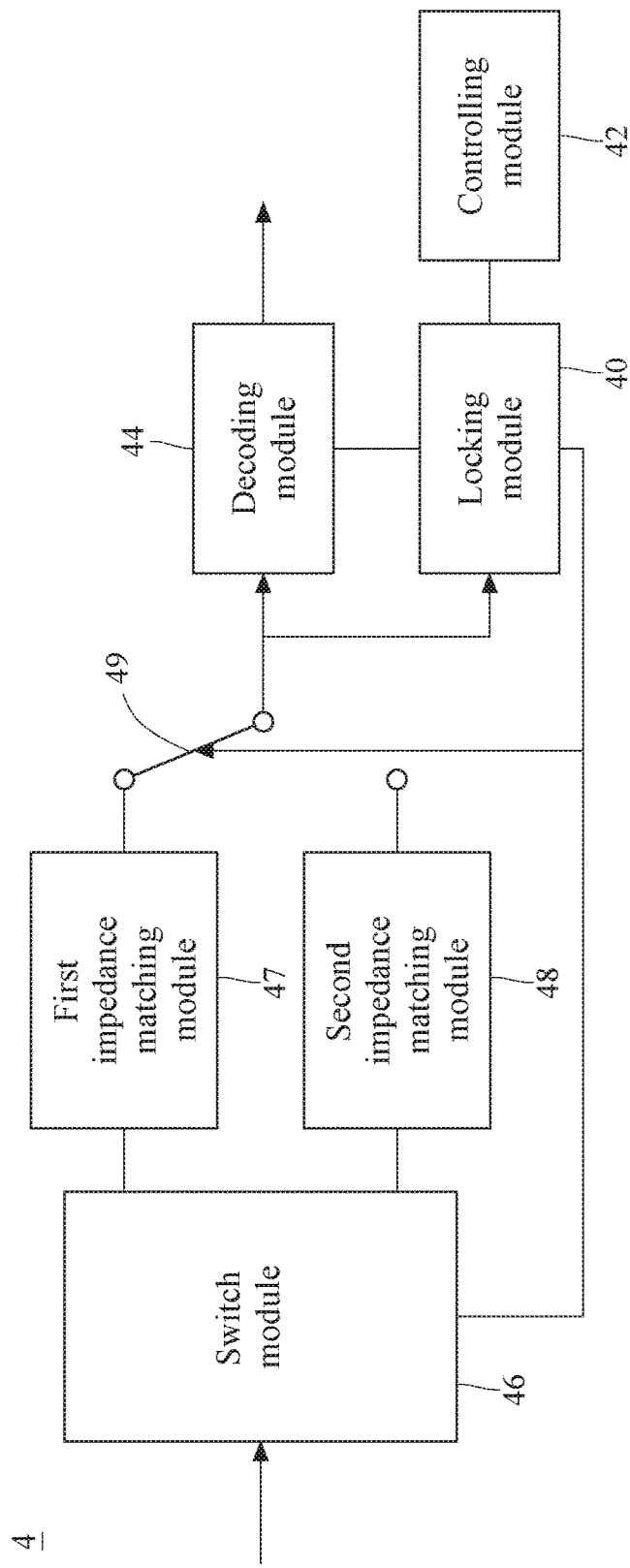
FIG. 4 is a structural diagram of the source driving device according to another embodiment.

Please refer to FIG. 4. FIG. 4 is a structural diagram of the source driving device according to another embodiment. As shown in FIG. 4, the source driving device 4 includes a locking module 40, a controlling module 42, and a decoding module 44. The coupling relationships and operation principles of the modules are substantially the same to the embodiment in FIG. 1, and are not explained hereinafter. The difference between the present embodiment and the embodiment in FIG. 1 is that the source driving device 4 further includes a switch module 46, a first impedance matching module 47, and a second impedance matching module 48. The switch module 46 receives the second display signal from the timing controlling device. The first impedance matching module 47 is coupled to the switch module 46 and is for providing a first impedance value matching with the output impedance of the timing controlling device in the first band. The second impedance matching module 48 is coupled to the switch module 46 and is for providing a second impedance value matching with the output impedance of the timing controlling device in the second band. When the locking module 40 locks the first clock signal synchronized to the first display signal in the first band, the switch module 46 sends the second display signal to the first impedance matching module 47 to output the first display signal. When the locking module 40 locks the first clock signal synchronized to the first display signal in the second band, the switch module 46 sends the second display signal to the second impedance matching module 48 to output the first display signal.

In addition, the source driving device 4 further includes a selection module 49. An input terminal of the selection module 49 is coupled to the first impedance matching module 47, and the other input terminal of the selection module 49 is coupled to the second impedance matching module 48, and an output terminal of the selection module 49 is coupled to the locking module 40 and the decoding module 44. When the locking module 40 locks the first clock signal synchronized to the first display signal in the first band, the selection module 49 sends the first display signal from the first impedance matching module 47 to the locking module 40 and the decoding module 44. When the locking module 40 locks the first clock signal synchronized to the first display signal in the second band, the selection module 49 sends the first display signal from the second impedance matching module 48 to the locking module 40 and the decoding module 44. In practice, the switch module 46 and the selection module 49 are further coupled to the locking module 40 to receive the control signal from the locking module 40 to decide the switched or selected path. More specifically, when the locking module 40 does not lock the first clock signal synchronized to the first display signal in any of the band yet, the control signal of the locking module 40 indicates the switch module 46 and the selection module 49 to send the first display signal to the locking module 40 and the decoding module 44 through a default switching path, such as the first impedance matching module 47. When the locking module 40 successfully locks the first clock signal synchronized to the first display signal in one of the bands, the control signal of the locking module 40 indicates the switch module 46 and the selection module 49 to switch to the corresponding path. By matching the input impedance of the source driving device 4 with the output impedance of the timing controlling device to the display signal in different bands, the accuracy of impedance matching is enhanced and better signal transmission performance is achieved.

Figure 5:
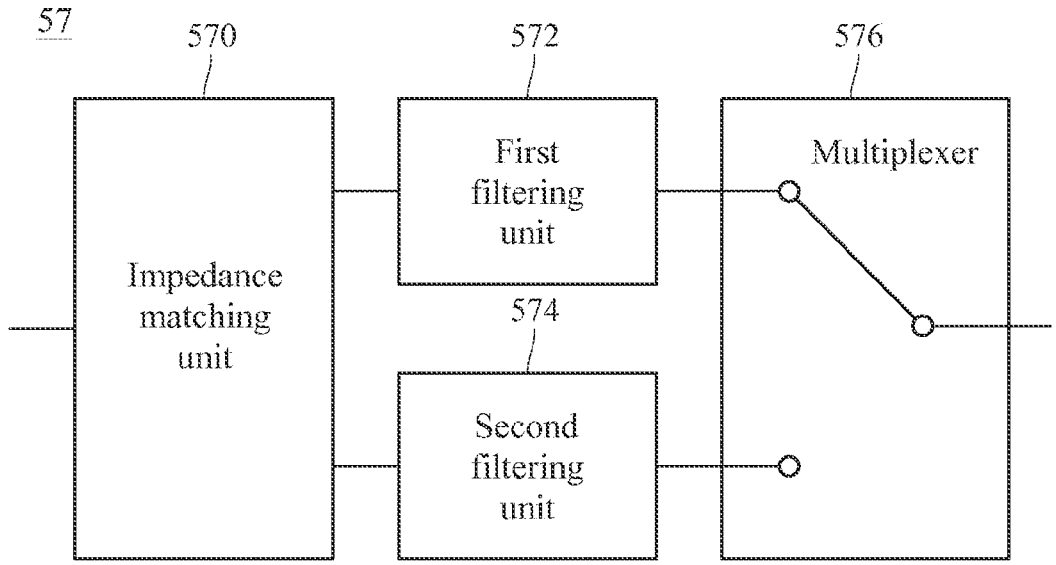
FIG. 5 is a structural diagram of the first impedance matching module according to an embodiment.

Please refer to FIG. 4 and FIG. 5 together. FIG. 5 is a structural diagram of the first impedance matching module according to an embodiment. As shown in FIG. 5, the first impedance matching module 57 includes an impedance matching unit 570, a first filtering unit 572, a second filtering unit 574, and a multiplexer 576. The impedance matching unit 570 is coupled to the first filtering unit 572 and the second filtering unit 574, and is for providing a first impedance value matching with the output impedance of the timing controlling device in the first band. In order to improve the efficiency of the impedance matching, the first band is divided to a first sub band and a second sub band. The first filtering unit 572 is a band pass filter corresponding to the first sub band, and is for filtering the signals outside the first sub band to optimize the second display signal in the first sub band. The second filtering unit 574 is a band pass filter corresponding to the second sub band, and is for filtering the signals outside the second sub band to optimize the second display signal in the second sub band.

An input terminal of the multiplexer 576 is coupled to the first filtering unit 572 and the other input terminal is coupled to the second filtering unit 574. The multiplexer 576 is for receiving the first display signal from the first filtering unit 572 and the second filtering unit 574. In addition, the multiplexer 576 is further coupled to the locking module 40. When the locking module 40 locks the first clock signal synchronized to the first display signal in the first sub band, the locking module 40 indicates the multiplexer 576 with the control signal to output the first display signal from the first filtering unit 572. When the locking module 40 locks the first clock signal synchronized to the first display signal in the second sub band, the locking module 40 indicates the multiplexer 576 with the control signal to output the first display signal from the second filtering unit 574. In practice, the division of the sub band and the displacement of the filtering unit are adjusted according to the system cost and the impedance matching performance simultaneously. For example, the number of the sub bands and the corresponding filtering units are increased and the control signal is adjusted to increase the precision of the impedance matching and the impedance matching performance. In another embodiment, the second impedance matching module 48 in FIG. 4 also has the structure of the first impedance matching module 57 and is not further explained hereinafter.

Figure 6:
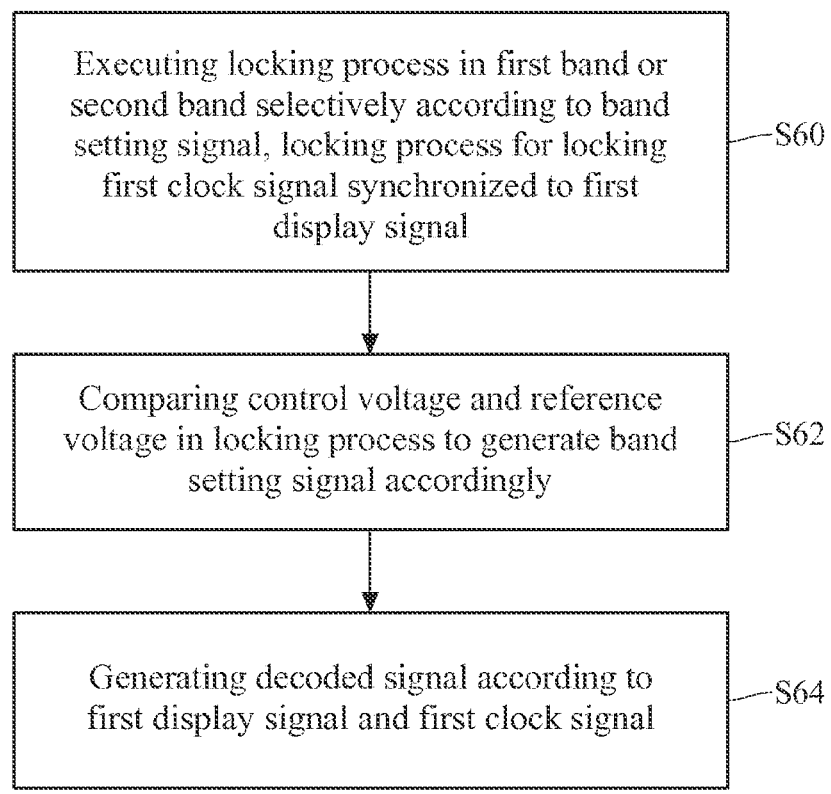
FIG. 6 is a flowchart of the method for receiving display signal according to an embodiment.

Please refer to FIG. 1 and FIG. 6 together. FIG. 6 is a flowchart of the method for receiving display signal according to an embodiment. The method for receiving display signal is adapted for the source driving device 1. In the step S60, the locking module 10 executes the locking process in the first band or the second band selectively according to the band setting signal. The locking process is for locking the first clock signal synchronized to the first display signal. In the step S62, the controlling module 12 compares the control voltage with the reference voltage in the locking process to generate the band setting signal accordingly. In the step S64, the decoding module 14 generates a decoded signal according to the first display signal and the first clock signal. The steps and operation principles of the method for receiving display signal in other embodiments are explained in the related embodiments and are not further explained hereinafter.

Figure 7:
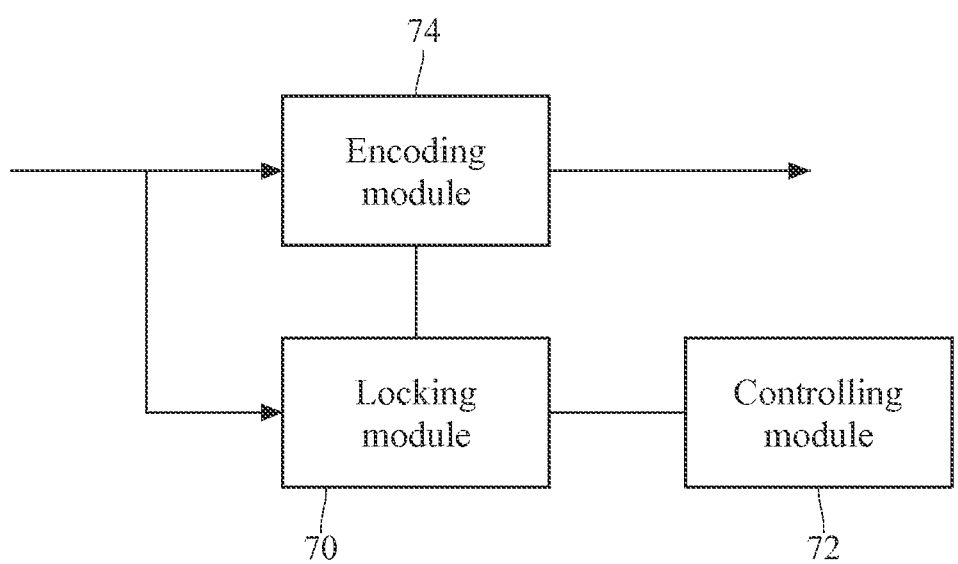
FIG. 7 is a structural diagram of the timing controlling device according to an embodiment.

Please refer to FIG. 7. FIG. 7 is a structural diagram of the timing controlling device according to an embodiment. As shown in FIG. 7, the timing controlling device 7 includes a locking module 70, a controlling module 72, and an encoding module 74. The locking module 70 executes the locking process in the first band or the second band selectively according to the band setting signal, so that the locking module 70 locks the third clock signal synchronized to the third display signal. Moreover, the controlling module 72 is coupled to the locking module 70 and is for comparing the control voltage with the reference voltage in the locking process to generate the band setting signal accordingly. In addition, the encoding module 74 is coupled to the locking module 70 and is for generating the encoded signal according to the third display signal and the third clock signal. In practice, the selectivity of the band is increased or the size of the band is adjusted according to the capability of the locking module 70 and the efficiency concerns. For example, when the supported frequency range of the locking module 70 is wider, more bands are divided. On the contrary, when the supported frequency range of the locking module 70 is narrower, fewer bands are divided. When enhancing the efficiency of the locking module 70 is needed, the band is adjusted to smaller to increase the locking stability. Therefore, the band is divided to 3 bands including 0.1 Gbps~3.6 Gbps, 3 Gbps~6.4 Gbps, and 6 Gbps~10 Gbps to execute the locking process as the embodiments of the source driving device. The locking module 70 and the controlling module capture the synchronized third clock signal from the third display signal in different bands. The encoding module 74 encodes the third display signal according to the third clock signal to generate the encoded signal, and sends the encoded signal to the source driving device. Please refer to FIG. 2 and FIG. 3 for the operations of the band setting and the locking module.

In practice, the timing controlling device is coupled to the source driving device. The timing controlling device encodes the received display signal for sending the display signal to the source driving device through the transmission channel. The encoded display signal includes the digital color data. The source driving device receives the encoded display signal and performs decoding, and converts the digital color data to analog voltage signal by DAC to drive the panel to display the images corresponding to the color data. For example, the source driving device automatically performs band detection to the inputted encoded signal to lock the synchronized clock signal for decoding, such as the source driving device 1 in FIG. 1. In another example, the automatically performs band detection to the inputted display signal to lock the synchronized clock signal for decoding, such as the timing controlling device 7 in FIG. 7. In addition, utilizing the source driving device 1 in FIG. 1 and the timing controlling device 7 in FIG. 7 together is also available to optimize the transmission efficiency of the display signal.

Figure 8:
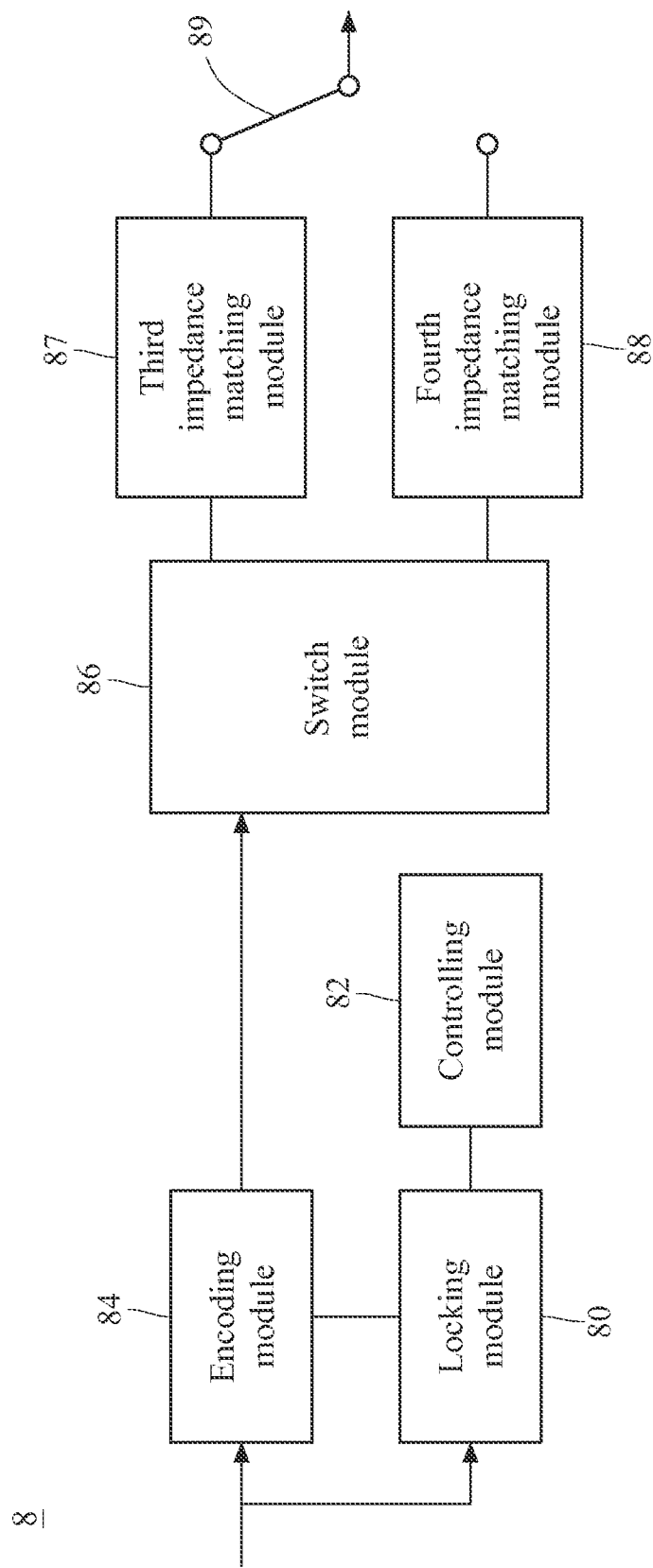
FIG. 8 is a structural diagram of the timing controlling device according to another embodiment.

Please refer to FIG. 8. FIG. 8 is a structural diagram of the timing controlling device according to another embodiment. As shown in FIG. 8, the timing controlling device 8 includes a locking module 80, a controlling module 82, and an encoding module 84, and the coupling relationships and the operations are substantially the same as the embodiment in FIG. 7 and are not further explained hereinafter. The difference between the present embodiment and the embodiment in FIG. 7 is that the timing controlling device 8 further includes a switch module 86, a third impedance matching module 87, and a fourth impedance matching module 88. The switch module 86 receives the encoded signal from the encoding module 84. The third impedance matching module 87 is coupled to the switch module 86 and is for providing a third impedance value matching with the input impedance of the source driving device in the first band. Moreover, the fourth impedance matching module 88 is coupled to the switch module 86 and is for providing a fourth impedance value matching with the input impedance of the source driving device in the second band. When the locking module 80 locks the third clock signal synchronized to the third display signal in the first band, the switch module 86 sends the encoded signal to the third impedance matching module 87 to output the fourth display signal to the source driving device. When the locking module 80 locks the third clock signal synchronized to the third display signal in the second band, the switch module 86 sends the encoded signal to the fourth impedance matching module 88 to output the fourth display signal to the source driving device.

In addition, the timing controlling device 8 further includes a selection module 89. An input terminal of the selection module 89 is coupled to the third impedance matching module 87, and the other input terminal is coupled to the fourth impedance matching module 88, and an output terminal is coupled to the source driving device. When the locking module 80 locks the third clock signal synchronized to the third display signal in the first band, the selection module 89 outputs the fourth display signal from the third impedance matching module 87 to the source driving device. When the locking module 80 locks the third clock signal synchronized to the third display signal in the second band, the selection module 89 outputs the fourth display signal from the fourth impedance matching module 88 to the source driving device. In practice, the switch module 86 and the selection module 89 are further coupled to the locking module 80 to receive the control signal from the locking module 80 to decide the switched or selected path. More specifically, when the locking module 80 does not lock the third clock signal synchronized to the third display signal in any of the bands yet, the control signal of the locking module 80 indicates the switch module 86 and the selection module 89 to send the third display signal to the source driving device through a default switching path, such as the third impedance matching module 87. When the locking module 80 successfully locks the third clock signal synchronized to the third display signal in one of the bands, the control signal of the locking module 80 indicates the switch module 86 and the selection module 89 to switch to the corresponding path. By matching the input impedance of the source driving device with the output impedance of the timing controlling device 8 to the display signal in different bands, the accuracy of impedance matching is enhanced and better signal transmission performance is achieved.

Figure 9:
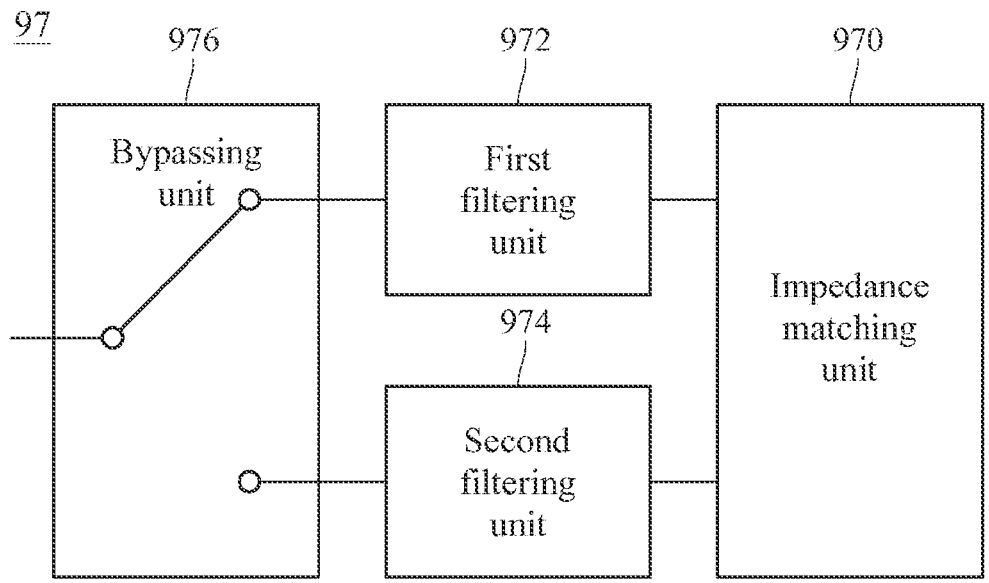
FIG. 9 is a structural diagram of the third impedance matching module according to an embodiment.

Please refer to FIG. 8 and FIG. 9. FIG. 9 is a structural diagram of the third impedance matching module according to an embodiment. As shown in FIG. 9, the third impedance matching module 97 includes a bypassing unit 976, a first filtering unit 972, a second filtering unit 974, and an impedance matching unit 970. In order to improve the efficiency of the impedance matching, the first band is divided to a first sub band and a second sub band. The bypassing unit 976 receives the encoded signal and is coupled to the locking module 80. When the locking module 80 locks the third clock signal synchronized to the third display signal in the first sub band, the locking module 80 controls the multiplexer 576 with the control signal to output the encoded signal to the first filtering unit 972. When the locking module 80 locks the third clock signal synchronized to the third display signal in the second sub band, the locking module 80 controls the multiplexer 576 with the control signal to output the encoded signal to the second filtering unit 974. The first filtering unit 972 is a band pass filter corresponding to the first sub band and is for filtering the signals outside the first sub band to optimize the encoded signal in the first sub band. The second filtering unit 974 is a band pass filter corresponding to the second sub band, and is for filtering the signals outside the second sub band to optimize the encoded signal in the second sub band. The impedance matching unit 970 is coupled to the first filtering unit 972 and the second filtering unit 974, and is for providing the third impedance value matching with the input impedance of the source driving device in the first band to generate the fourth display signal. In practice, the division of the sub band and the displacement of the filtering unit are adjusted according to the system cost and the impedance matching performance simultaneously. For example, the number of the sub bands and the corresponding filtering units are increased and the control signal is adjusted to increase the precision of the impedance matching and the impedance matching performance. In another embodiment, the fourth impedance matching module 88 in FIG. 8 also has the structure of the third impedance matching module 97 and is not further explained hereinafter.

Figure 10:
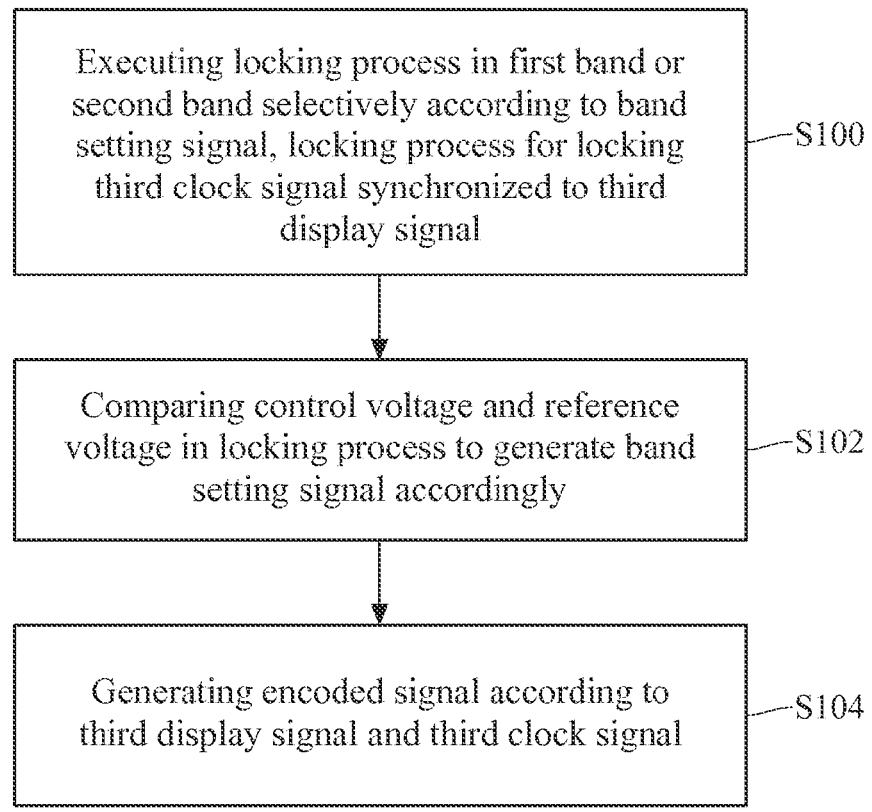
FIG. 10 is a flowchart of the method for transmitting display signal according to an embodiment.

Please refer to FIG. 7 and FIG. 10 together for explaining the method for transmitting display signal in an embodiment. FIG. 10 is a flowchart of the method for transmitting display signal according to an embodiment. The method for transmitting display signal is for the timing controlling device 7. In the step S100, the locking module 70 executes the locking process in the first band or the second band selectively according to the band setting signal, and the locking process is for locking the third clock signal synchronized to the third display signal. In the step S102, the controlling module 72 compares the control voltage with the reference voltage in the locking process to generate the band setting signal accordingly. In the step S104, the encoding module 74 generates the encoded signal according to the third display signal and the third clock signal. The steps and operation principles of the method for receiving display signal in other embodiments are explained in the related embodiments and are not further explained hereinafter.

The band detection is automatically executed to the display signal in the source driving device and the timing controlling device, so that the efficiency of the clock capturing is enhanced and supported range of the display signal for various resolutions and data rate is enlarged. In addition, by optimizing the impedance matching of the display signal in different bands, better signal transmission is achieved and the display quality is enhanced accordingly.

The foregoing description has been presented for purposes of illustration. It is not exhaustive and does not limit the disclosure to the precise forms or embodiments disclosed. Modifications and adaptations will be apparent to those skilled in the art from consideration of the specification and practice of the disclosed embodiments of the disclosure. It is intended, therefore, that the specification and examples be considered as exemplary only, with a true scope and spirit of the disclosure being indicated by the following claims and their full scope of equivalents.

What is claimed is:

1. A source driving device, comprising:
   a locking module circuit for executing a locking process in a first band or a second band according to a band setting signal or another band setting signal, the locking process for the locking module circuit to lock a first clock signal when the first clock signal is synchronized to a first display signal;
   a controller coupled to the locking module circuit, for comparing a control voltage with a reference voltage and calculating a frequency of which the control voltage is substantially greater than the reference voltage when the locking process is executed in the first band, and when the frequency substantially is greater than a threshold, the controller generates said another band setting signal to control the locking module circuit to execute the locking process in the second band; and
   a decoder coupled to the locking module circuit, for generating a decoded signal according to the first display signal and the first clock signal.

2. The source driving device of claim 1, wherein when the locking module circuit executes the locking process in the first band, the controller compares the control voltage with the reference voltage, and when the control voltage is substantially greater than the reference voltage, the frequency increases.

3. The source driving device of claim 1, wherein the locking module circuit comprises a phase detecting unit, a voltage generating unit, and a oscillating unit, and the phase detecting unit compares a phase of the first display signal with a phase of a second clock signal to generate a comparison result, and the voltage generating unit generates the control voltage according to the comparison result, and the oscillating unit generates the second clock signal according to the band setting signal and the control voltage, and when the phase of the first display signal and the phase of the second clock signal are substantially the same, the oscillating unit outputs the second clock signal as the first clock signal.

4. The source driving device of claim 3, wherein the oscillating unit outputs the second clock signal as the first clock signal when the phase of the first display signal and the phase of the second clock signal are different.

5. The source driving device of claim 3, wherein the phase detecting unit further compares a phase of the first display signal with a phase of another clock signal to generate another comparison result, and the voltage generating unit further generates another control voltage according to said another comparison result, and the oscillating unit further generates said another clock signal according to said another band setting signal and said another control voltage, and when the phase of the first display signal and the phase of the second clock signal are different as well as the phase of the first display signal and the phase of said another clock signal are different, the locking module executes the locking process in the first band.

6. The source driving device of claim 1, further comprising:
   a switch module circuit receiving a second display signal from a timing controlling device;
   a first impedance matching module circuit coupled to the switch module circuit, for providing a first impedance value matching with a output impedance of the timing controlling device in the first band; and
   a second impedance matching module circuit coupled to the switch module circuit, for providing a second impedance value matching with a output impedance of the timing controlling device in the second band;
   wherein when the locking module circuit locks the first clock signal synchronized to the first display signal in the first band, the switch module circuit sends the second display signal to the first impedance matching module circuit to output the first display signal, and when the locking module circuit locks the first clock signal synchronized to the first display signal in the second band, the switch module circuit sends the second display signal to the second impedance matching module circuit to output the first display signal.

7. The source driving device of claim 6, wherein the first band is divided to a first sub band and a second sub band, and the first impedance matching module comprises:
   a first filter corresponding to the first sub band and filtering out signals outside the first sub band to optimize the second display signal from the switch module circuit in the first sub band; or
   a second filter corresponding to the second sub band and filtering out signals outside the second sub band to optimize the second display signal from the switch unit in the second sub band.

8. A method for receiving display signal, comprising:
   executing a locking process in a first band according to a band setting signal, the locking process for locking a first clock signal when the first clock signal is synchronized to a first display signal;

comparing a control voltage and a reference voltage when the locking process is executed in the first band;

calculating a frequency of which the control voltage is substantially greater than the reference voltage;

when the frequency is substantially greater than a threshold, generating another band setting signal to execute the locking process in a second band; and generating a decoded signal according to the first display signal and the first clock signal.

9. The method for receiving display signal of claim 8, wherein the step of calculating the frequency of which the control voltage is substantially greater than the reference voltage comprises:

when the control voltage is substantially greater than the reference voltage, increasing the frequency.

10. The method for receiving display signal of claim 8, wherein the step of executing the locking process in the first band according to the band setting signal comprises:

comparing a phase of the first display signal with a phase of a second clock signal in the first band to generate a comparison result; and generating the control voltage according to the comparison result;

generating the second clock signal according to the band setting signal and the control voltage; and when the phase of the first display signal and the phase of the second clock signal are substantially the same, outputting the second clock signal as the first clock signal.

11. The method for receiving display signal of claim 8, further comprising:

receiving a second display signal from a timing controlling device;

providing a first impedance value matching an output impedance of the timing controlling device in the first band;

providing a second impedance value matching the output impedance of the timing controlling device in the second band;

when the first band locks the first clock signal synchronized to the first display signal, generating the first display signal in association with the first impedance value according to the second display signal; and when the second band locks the first clock signal synchronized to the first display signal, generating the first display signal in association with the second impedance value according to the second display signal.

12. The method for receiving display signal of claim 11, wherein the first band is divided to a first sub band and a second sub band, and the method further comprises:

filtering out signals outside the first sub band to optimize the second display signal from the switch unit in the first sub band or filtering out signals outside the second sub band to optimize the second display signal from the switch unit in the second sub band.

13. The method for receiving display signal of claim 8, wherein the step of executing the locking process in the first band according to the band setting signal comprises:

when the phase of the first display signal and the phase of the second clock signal are different, outputting the second clock signal as the first clock signal.

14. The method for receiving display signal of claim 8, wherein the step of executing the locking process in the second band according to said another band setting signal comprises:

comparing a phase of the first display signal with a phase of another clock signal in the second band to generate another comparison result; and generating another control voltage according to said another comparison result;

generating said another clock signal according to said another band setting signal and said another control voltage; and when the phase of the first display signal and the phase of the second clock signal are different and the phase of the first display signal and the phase of said another clock signal are different, executing the locking process in the first band.

\* \* \* \* \*